United States Patent
Deeney et al.

(10) Patent No.: US 6,791,184 B2
(45) Date of Patent: Sep. 14, 2004

(54) SUPPORT ASSEMBLY FOR AN INTEGRATED CIRCUIT PACKAGE HAVING SOLDER COLUMNS

(75) Inventors: Jeffrey L Deeney, Fort Collins, CO (US); Laszlo Nobi, Fort Collins, CO (US); Joseph D. Dutson, Loveland, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 15 days.

(21) Appl. No.: 10/202,416

(22) Filed: Jul. 23, 2002

(65) Prior Publication Data

US 2004/0017006 A1 Jan. 29, 2004

(51) Int. Cl.⁷ .............................. H01L 23/34; H05K 1/14
(52) U.S. Cl. ...................... 257/726; 257/727; 257/730; 257/732; 361/740; 361/743; 361/759; 361/801
(58) Field of Search ................................. 257/731, 732, 257/678, 723, 724, 726, 727, 729, 730, 733, 779, 780; 361/600, 679, 728, 736, 740, 741, 743, 747, 748, 752, 756, 759, 784, 796, 801, 802

(56) References Cited

U.S. PATENT DOCUMENTS

| | | | | |
|---|---|---|---|---|
| 5,323,845 A | * | 6/1994 | Kin-shon | 165/80.3 |
| 5,917,700 A | * | 6/1999 | Clemens et al. | 361/704 |
| 6,188,131 B1 | * | 2/2001 | Nereng | 257/718 |
| 6,193,205 B1 | * | 2/2001 | Wang | 248/510 |
| 6,205,026 B1 | * | 3/2001 | Wong et al. | 361/704 |
| 6,243,265 B1 | * | 6/2001 | Wong et al. | 361/704 |
| 6,343,019 B1 | * | 1/2002 | Yu et al. | 361/704 |
| 6,344,971 B1 | * | 2/2002 | Ju | 361/704 |
| 6,441,480 B1 | * | 8/2002 | Takeuchi et al. | 257/706 |
| 6,465,728 B1 | * | 10/2002 | McLaughlin et al. | 174/16.3 |
| 6,587,079 B1 | * | 7/2003 | Rickard et al. | 342/387 |
| 6,600,661 B1 | * | 7/2003 | Deeney | 361/801 |
| 2002/0068417 A1 | | 6/2002 | Farnworth et al. | |

* cited by examiner

*Primary Examiner*—Alonzo Chambliss

(57) ABSTRACT

A support assembly for supporting an integrated circuit package with an array of solder columns extending from a bottom surface of the integrated circuit package to a circuit board preferably includes: a pair of shims for supporting the integrated circuit package, the shims being positioned along opposite edges of the integrated circuit package and placed between and abutting the integrated circuit package and the circuit board; and a retention clip for aligning and securing in place the pair of shims.

40 Claims, 5 Drawing Sheets

SUPPORT ASSEMBLY FOR AN INTEGRATED CIRCUIT PACKAGE HAVING SOLDER COLUMNS

FIELD OF THE INVENTION

The present invention relates to circuit components mounted on circuit boards by solder column interconnects or arrays.

BACKGROUND OF THE INVENTION

Advances in the electronics industry have created a demand for dense placement of electronic components on circuit boards. As a result, new technologies have been developed that allow circuit boards to accommodate an increasing number of components without becoming excessively large.

One such technology that is widely used is called flip-chip technology. Flip-chip technology includes area array technologies such the column grid array (CGA) technology. In flip-chip technologies, a semiconductor device, or integrated circuit (IC) package, having a pattern of conductive pads on a substrate, is joined face down to a circuit board or some other substrate.

A CGA IC package, for example, has a substrate with an array of solder columns that extend out from it, typically from the bottom surface. The substrate is typically composed of a ceramic material. Solder column interconnects or arrays are used to connect the IC package to the circuit board. The solder columns are attached at one end to connection pads or locations on the ceramic substrate. The solder columns are then soldered to respective pads on the circuit board using known techniques, such as a convection reflow solder process. The solder columns, therefore, establish interconnections that allow for electrical communication between the circuit board and the IC package.

The solder columns are of a sufficient height that, when an IC package is placed on a circuit board, the solder columns compensate for a coefficient of thermal expansion (CTE) mismatch. The CTE mismatch is the difference in the CTEs of the IC package and the circuit board and can produce stresses at the solder joints.

One problem with solder column arrays is that the solder columns do not withstand compressive force well. The solder columns are typically made of a 90%/10% Lead/Tin (Pb/Sn) solder, making them soft. Moreover, the individual solder columns are typically very thin. Consequently, if any significant amount of compressive force is applied to an IC package that is connected to a circuit board with a solder column array, the solder columns might, over time, compress and compromise the reliability of the IC package or circuit board.

Such compressive force could be the result of a cooling solution, such as a heat sink or fan, which is mounted on top of the IC package. In some instances, loads in excess of about 10 to 20 grams per solder column can exert sufficient compressive force to compromise reliability. Even without an attached cooling solution, the IC package itself might be too heavy for the solder columns to support without risk of solder column damage. Solder column damage such as solder column compression, bending, and breaking can result in shorting, IC package malfunction, or permanent destruction of the IC package or circuit board.

Cooling solutions often have considerable mass. It is not unusual for a cooling solution to exceed one pound. When large cooling solutions are exposed to shock and vibration that may be encountered during system operation, it is not uncommon to have thirty to forty pounds of force applied to the top of the IC package. This large load force can cause the solder columns to bend, deform, or break.

In addition to the large loads that could be present during shock and vibration, there is often a constant load of as much as 70 pounds applied to the cooling solution to maintain a good compressive force at the thermal interface between the cooling solution and the IC package. This constant compressive force could also cause significant column deformation over time.

One approach to minimize or eliminate solder column damage due to a load placed on a solder column array is to alleviate pressure exerted by a cooling solution that has been attached to an IC package by placing support columns between the circuit board and the attached cooling solution. However, this approach is obviously not applicable to IC packages that do not require the use of a cooling solution. The process of attaching the support columns also requires the undesirable use of some type of adhesive, such as an epoxy adhesive. Epoxy adhesives are not a preferred manufacturing solution because of handling and processing issues that are known in the art.

SUMMARY OF THE INVENTION

In one of many possible embodiment, the present invention provides a support assembly for supporting an integrated circuit package with an array of solder columns extending from a bottom surface of the integrated circuit package to a circuit board. The support assembly preferably includes a pair of shims for supporting the integrated circuit package, the shims being positioned along opposite edges of the integrated circuit package and placed between and abutting the integrated circuit package and the circuit board and a retention clip for aligning and securing in place the pair of shims.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate various embodiments of the present invention and are a part of the specification. Together with the following description, the drawings demonstrate and explain the principles of the present invention. The illustrated embodiments are examples of the present invention and do not limit the scope of the invention.

DETAILED DESCRIPTION OF THE PREFERRED EMBODIMENTS

The present invention provides a method and system whereby a solder column array is supported with a support assembly. The support assembly preferably includes two perimeter stops, or shims, and a retention clip that aligns the two shims correctly with an IC package and that retains the shims in their proper positions.

Using the drawings, the preferred embodiments of the present invention will now be explained.

Figure 1:
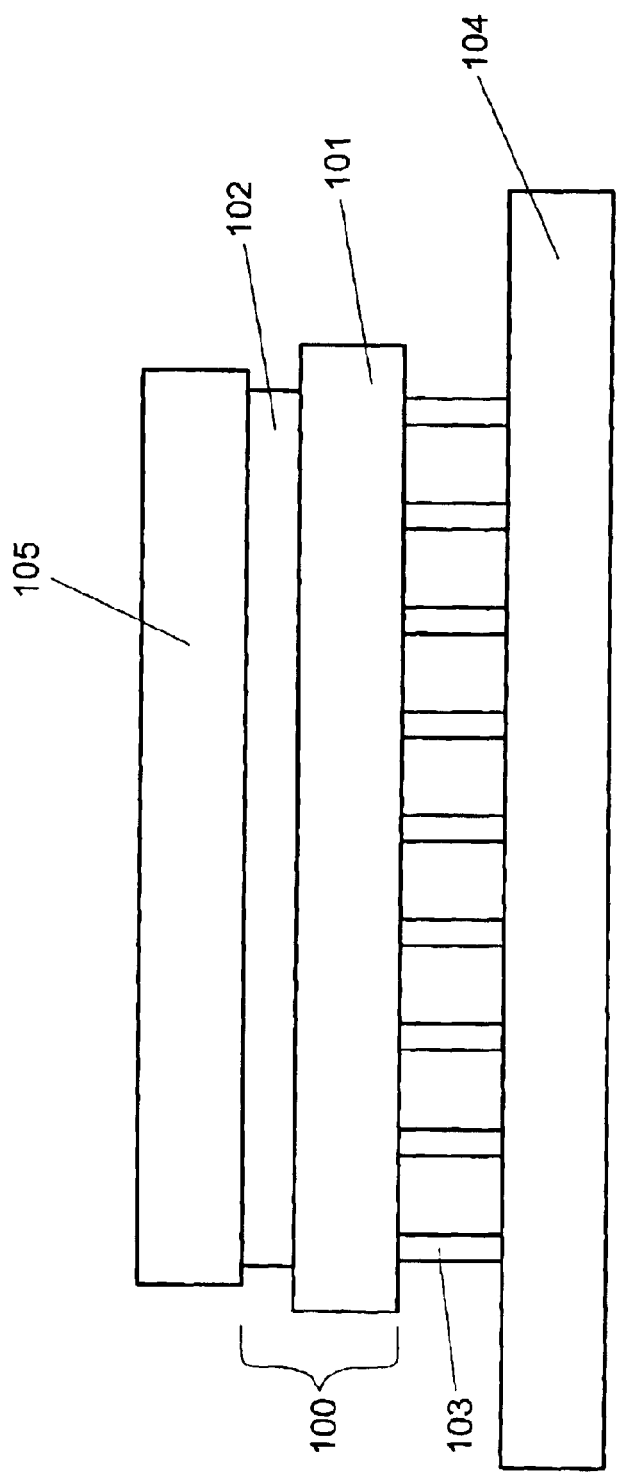
FIG. 1 is a diagram of an exemplary CGA integrated circuit configuration that could be used in conjunction with an embodiment of the present invention.

FIG. 1 is a diagram of an exemplary CGA integrated circuit (100) configuration that could be used in conjunction with an embodiment of the present invention. It should be understood that while the invention is described using a CGA integrated circuit package (100), it is not limited to CGA integrated circuit packages and can be utilized on any circuit package having a solder column array. Such circuit packages can be, but are not limited to, a central processing unit (CPU) package, an application specific integrated circuit (ASIC), or a memory unit.

Referring to FIG. 1, the CGA integrated circuit package (100) has a substrate (101), usually made of ceramic, and a package lid (102). A solder column array having an array of solder columns (103) extends from a bottom side of the substrate (101). When the CGA integrated circuit package (100) is mounted on a circuit board (104), the solder columns (103) are soldered to respective connection pads on the circuit board (104). The circuit board (104) can be a printed circuit board (PCB), for example. An optional cooling solution (105) can be mounted on top of the package lid (102). The cooling solution (105) can be a heat sink, fan, or any other cooling device.

Figure 2:
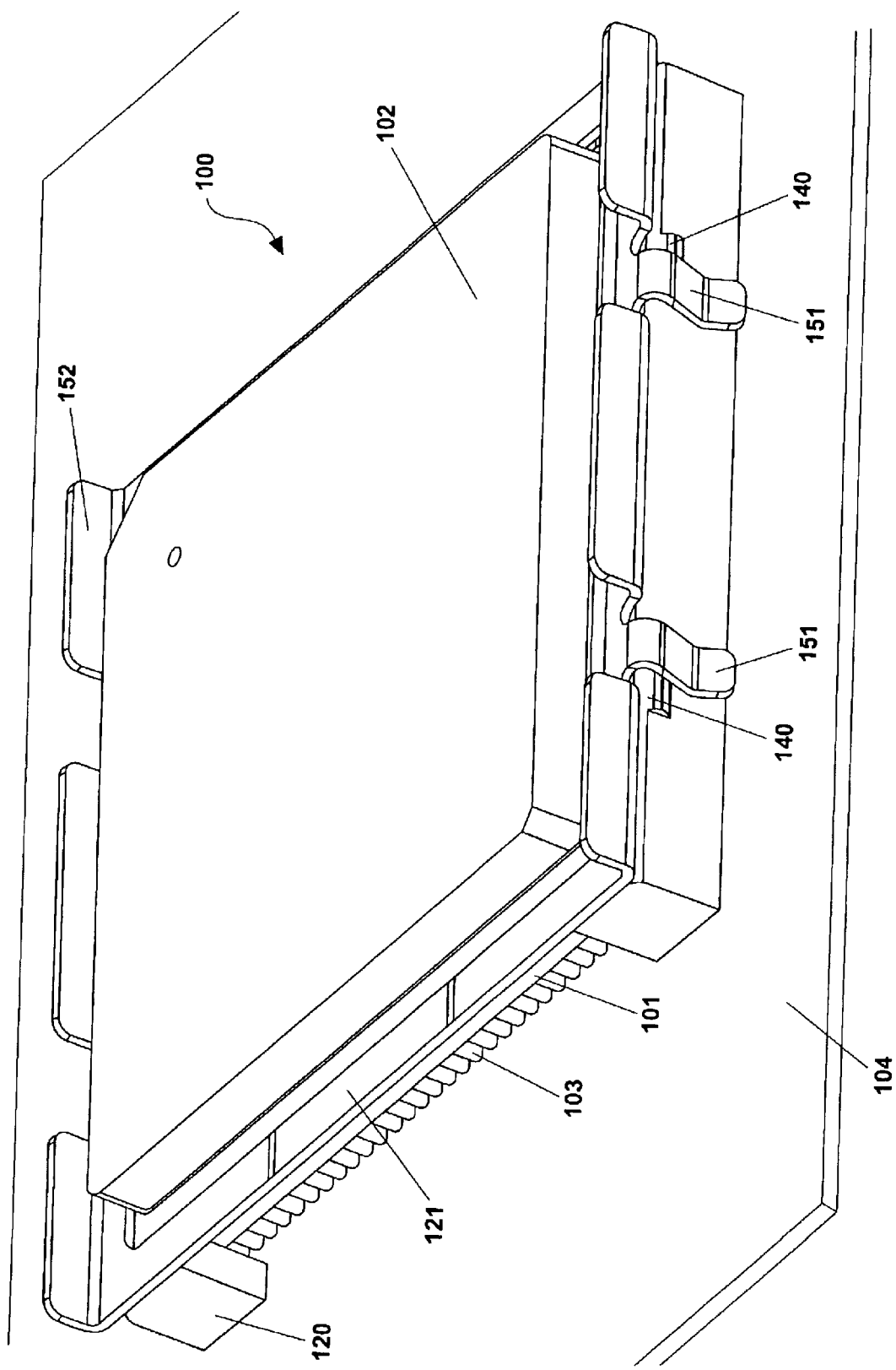
FIG. 2 is an illustration of an IC package that has been connected to a circuit board incorporating an embodiment of the present invention.

FIG. 2 illustrates an embodiment of the present invention. An IC package (100) is connected to a circuit board (104) with an array of solder columns (103) that extend from the bottom side of the IC package substrate (101) to a circuit board (104). After the solder columns (103) are soldered to connection pads on the circuit board (104), two opposing shims (120), or perimeter stops, are inserted between edges of the substrate (101) and the circuit board (104) such that after the solder columns (103) slightly creep, or compress, due to a downward force exerted by the IC package (100), the opposing shims (120) are secured in place between the edges of the substrate (101) and the circuit board (104).

The shims (120) provide support for the solder columns (103) and allow for a cooling solution (105; FIG. 1) to be mounted on top of the IC package lid (102) without damage to the solder columns (103). The shims (120) will be explained in more detail in connection with FIG. 3 and FIG. 4. It is important to note that the use of an adhesive, such as an epoxy adhesive, to attach the shims (120) to the circuit board (104) and the substrate (101) of the IC package (100) is not necessary under the principles of the present invention.

As shown in FIG. 2, the two shims (120) preferably run parallel to and extend along opposite sides of the IC package (100) in order to provide stable support for the IC package (100). However, the shims (120) do not necessarily have to extend the entire length of the IC package.

The CTE of the shim (120) material preferably closely matches the CTE of the solder columns (103). For example, to match a 90%/10% Lead/Tin (Pb/Sn) solder column (103) is 27–29 parts per million per degree centigrade (ppm/° C.).

The shims (120) can be made of plastic, such as Torlon™ from Solvay™, zinc, stainless steel, or some other material capable of supporting the weight of the IC package (100) and an optional cooling solution (105; FIG. 1).

As shown in FIG. 2, after the shims (120) are inserted between the edges of the substrate (101) and the circuit board (104), a retention clip (121) is preferably inserted on top of the shims (120). The retention clip (121) aligns and holds the shims (120) in place. The retention clip (121) will be explained in more detail below in connection with FIG. 5.

Using FIG. 3 and FIG. 4, the preferred embodiments of the shims (120) will now be explained.

Figure 3:
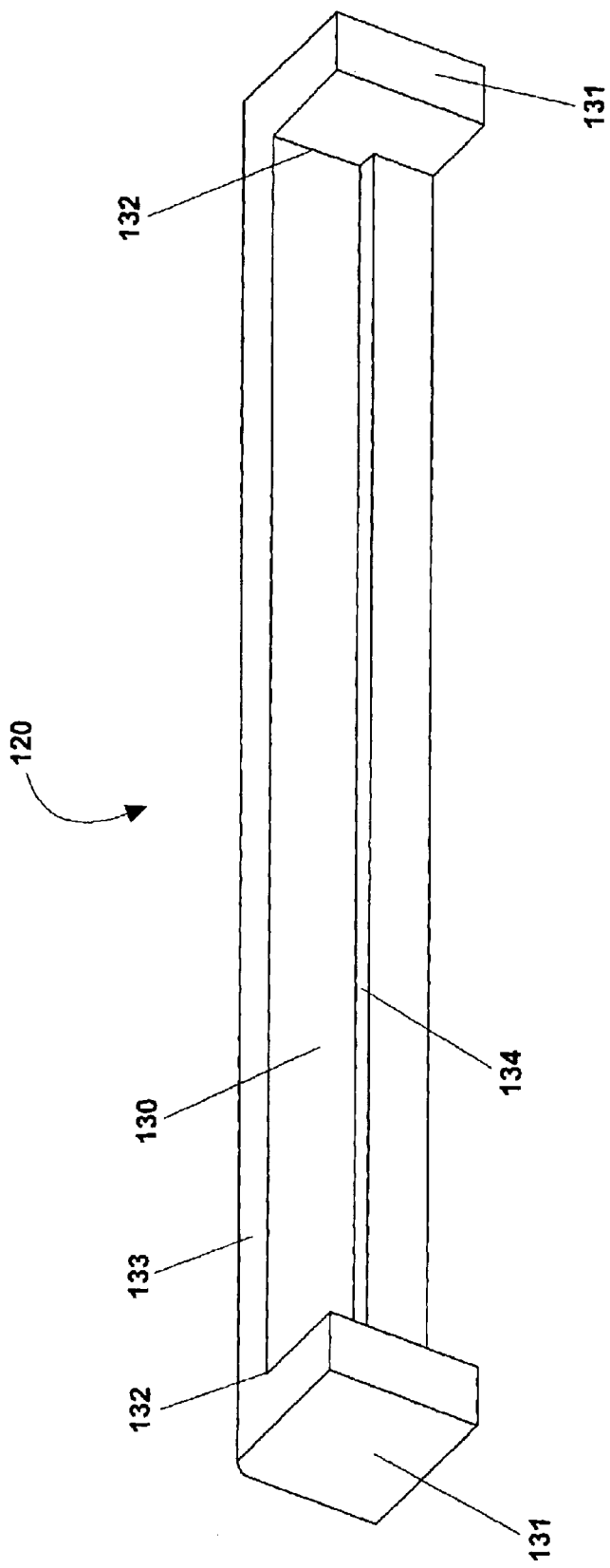
FIG. 3 is an illustration of the inner surface of an exemplary shim that can be used to implement an embodiment of the present invention.

FIG. 3 shows the inner surface of an exemplary shim (120) that can be used to implement an embodiment of the present invention. As shown in FIG. 3, the shim (120) preferably includes a main body (130) with a length approximately equal to the length of an edge of the IC substrate (101; FIG. 1) along which the shim (120) extends.

In one embodiment, as shown in FIG. 3, the shim (120) also includes two protrusions, or ears (131), that extend in the same perpendicular direction from the ends of the main body (130) of the shim (120). The ears (131) form corners (132) that contain the IC substrate (101; FIG. 1) corners when the IC package (100; FIG. 1) is attached to the circuit board (104; FIG. 1), as shown in FIG. 2.

These corners (132) provide alignment to the corners of the IC package (100; FIG. 1) and prevent the shims (120) from moving laterally. The lengths of the ears (131) of a particular shim (120) can be selected as best suits a particular application, but the ears (131) should not extend a length that would interfere with the ears (131) of another shim (120) that is used along an opposite side of the IC package.

While the use of ears (131) is part of a preferred embodiment of the present invention, use of ears (131) on the shim (120) is not strictly necessary. Even without the ears (131), the main body (130) of the shim (120) can support an IC package and prevent unwanted compression of the solder columns under the IC package.

As shown in FIG. 3, the shim (120) preferably has a flat top surface (133) on the main body (130) and the ears (131) upon which the retention clip (121; FIG. 2) rests when it is engaged. The inner surface of the shim (120) also has a narrow protruding shelf (134) that is used to abut and support the bottom surface of the IC substrate (101; FIG. 1). This support provided by the shelf (134) removes load pressure from the solder columns (103; FIG. 1) that extend from the underside of the IC package to the circuit board or other substrate below. The shelf (134) is preferably a widthwise extension of a lower portion of the main body (130). The height of the shelf (134) is determined by the height of the solder columns (103; FIG. 1). The shelf's (134) height is such that the IC substrate (101; FIG. 1) rests on the shelf (134) without unduly compressing the solder columns (103; FIG. 1) that extend from the underside of the IC package (100; FIG. 1).

Figure 4:
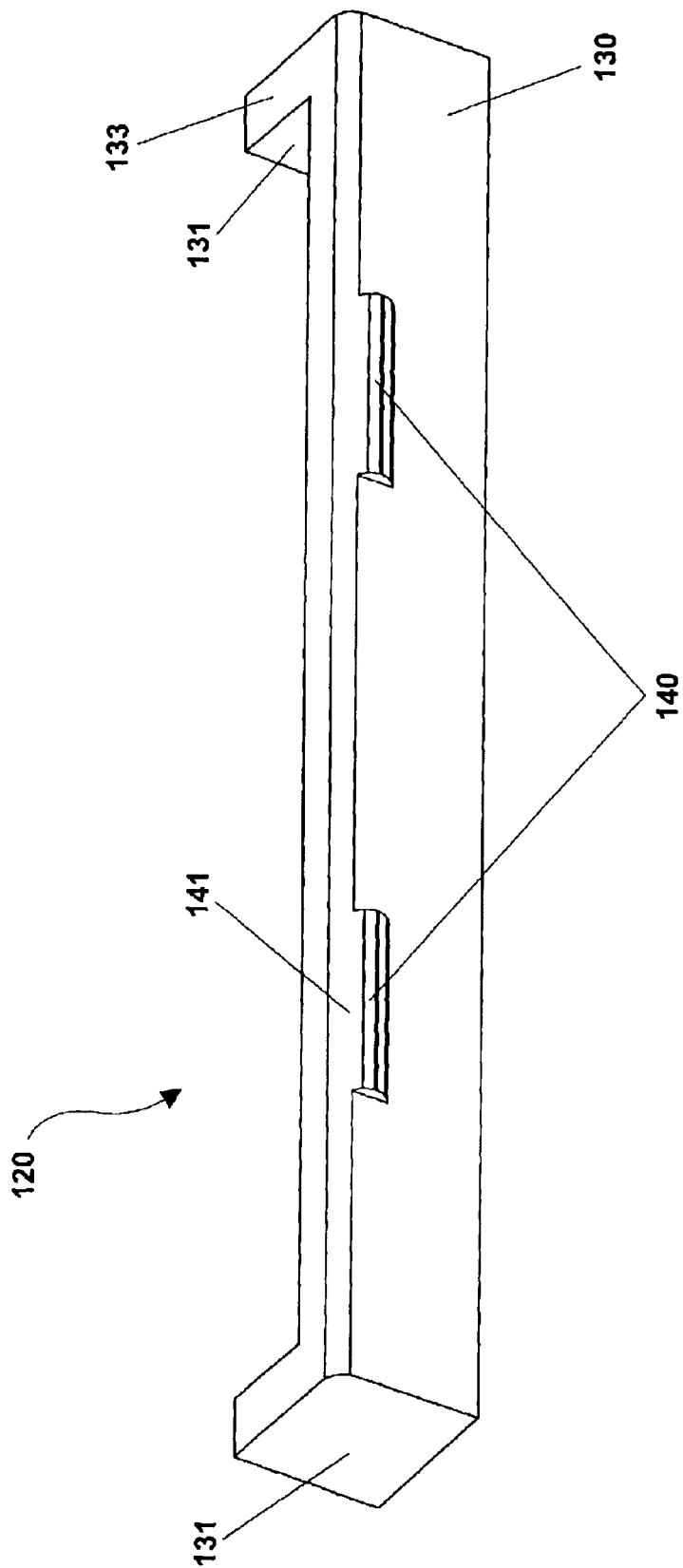
FIG. 4 is an illustration of the outer surface of an exemplary shim that can be used to implement an embodiment of the present invention.
Figure 5:
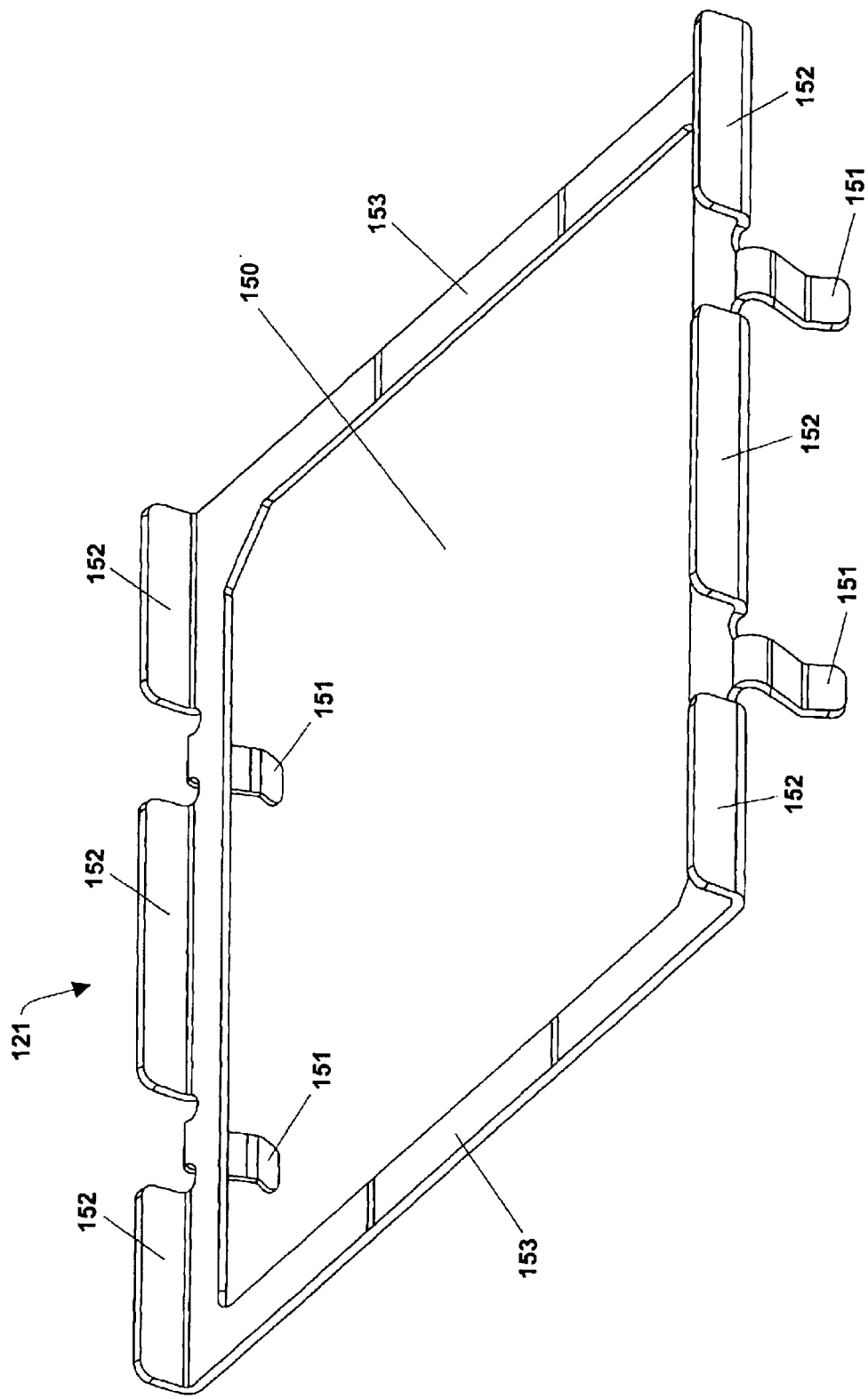
FIG. 5 is an illustration of an exemplary retention clip that can be used to implement an embodiment of the present invention.

FIG. 4 shows the outer surface of the exemplary shim (120) that can be used to implement an embodiment of the present invention. As shown in FIG. 4, there are preferably small bumps (140) on the outer surface of the main body (130) of the shim (120). These bumps (140) are used to provide a positive snap feature for engagement of the retention clip (121; FIGS. 2&5). Directly above each of the bumps (140), there is a beveled, or slanted, surface (141) that allows smooth engagement with the retention clip (121; FIGS. 2&5). Although FIG. 4 shows two bumps (140) on the outer surface of the shim (120), any number of bumps (120) or other attachment devices, such as notches, can be used to enable engagement of the retention clip (121; FIGS. 2&5) under the principles of the present invention. The attachment devices are preferably uniformly distributed along the shims (120) so as to uniformly distribute the retention force across the shims (120). However, the use of bumps (140) or any other attachment device is not necessary to implement the present invention.

Using the diagram of FIG. 5, the preferred embodiments of the retention clip (121) will now be explained.

FIG. 5 shows an exemplary retention clip (121) which can be used in conjunction with some embodiments of the present invention. The retention clip (121) is preferably made of stainless steel. A stainless steel retention clip (121) has desirable spring characteristics and does not need secondary plating. However, the retention clip (121) can be made of other materials such as plastic, beryllium-copper metal, or spring steel, for example.

As shown in FIG. 5, the retention clip (121) has a center opening (150) that aligns the retention clip (121) to the IC package lid (102; FIG. 1). For example, FIG. 2 shows the IC package lid (102) being received in and protruding through the center opening (150; FIG. 5) of the retention clip (121).

Returning to FIG. 5, the retention clip (121) preferably has a number of clamping tabs (151) that extend down from the retention clip (121). The clamping tabs (151) are positioned so that they snap over the bumps (140; FIG. 4) present on the outer surface of the shims (120; FIG. 2) and secure the retention clip (121) to the shims (120; FIG. 2) when downward pressure is exerted on the retention clip (121). The clamping tabs (151) are shaped in a way (e.g.; bent ends) that allows the clamping tabs (151) to positively snap over the bumps (140; FIG. 4) on the shims (120; FIG. 4). However, the clamping tabs (151) are not necessary to implement the present invention.

The number of clamping tabs (151) is preferably the same as the number of bumps (140; FIG. 4) present on the outer surface of the shims (120; FIG. 2). FIG. 5 shows an exemplary case where the retention clip (121) has four clamping tabs (151). This corresponds to the exemplary shims (120) illustrated in FIGS. 3 and 4.

FIG. 5 also illustrates an embodiment in which the retention clip (121) also has upwardly extending tabs (152). These upwardly extending tabs (152) provide a convenient surface for handling the retention clip (121) during assembly. The upwardly extending tabs (152) may also abut a cooling solution (e.g., 105; FIG. 1) that is optionally installed on the IC package lid (102: FIG. 1). This will further prevent the retention clip (121) from sliding upwards after such a cooling solution (105; FIG. 1) is attached to the IC package lid (102; FIG. 1). Although the illustration in FIG. 5 shows six upwardly extending tabs (152), the number of such tabs (152) present on a retention clip (121) can be more or less than six as best serves a particular application.

FIG. 5 illustrates an additional optional feature in which the retention clip (121) has curved beams (153) located in the middle of the two sides of the retention clip (121) that do not have the clamping tabs (151) disposed thereon. When the curved beams (153) are pressed with a downward force, they generate a positive clamping force on the clamping tabs (151), allowing the clamping tabs (151) to more readily snap over and engage the bumps (140; FIG. 4) of the shims (120; FIG. 2).

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best illustrate the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A support assembly for supporting an integrated circuit package with an array of solder columns extending from a bottom surface of said integrated circuit package to a circuit board, said support assembly comprising:

a pair of shims for supporting said integrated circuit package, said shims being positioned along opposite edges of said integrated circuit package and placed between and abutting said integrated circuit package and said circuit board; and a retention clip for aligning and securing in place said pair of shims;

wherein said shims maintain a separation between said integrated circuit package and said circuit board and prevent compression of said solder columns which extend across said separation between said integrated circuit package and said circuit board.

2. The support assembly of claim 1, wherein an installation of said support assembly does not require an adhesive.

3. The support assembly of claim 1, wherein each of said shims comprises protrusions from ends of said shims for aligning corners of said integrated circuit package, said protrusions protruding at about a 90 degree angle from a main body of said shims.

4. The support assembly of claim 3, wherein said shims each further comprise a shelf protruding from an inner surface of said shim, said edges of said integrated circuit package resting on said shelves.

5. The support assembly of claim 1, wherein said shims comprise at least one attachment device on an outer surface of said shims.

6. The support assembly of claim 5, wherein said at least one attachment device comprises a raised bump.

7. The support assembly of claim 6, wherein said each of said shims has two bumps.

8. The support assembly of claim 6, wherein said outer surface of said shims further comprises beveled surfaces above said bumps for allowing a smooth engagement of said retention clip.

9. The support assembly of claim 5, wherein said retention clip comprises at least one clamping tab for engaging said at least one attachment device.

10. The support assembly of claim 9, wherein ends of said clamping tab are bent away from said retention clip.

11. The support assembly of claim 9, wherein:

said at least one clamping tab comprises a plurality of clamping tabs; and said retention clip further comprises curved beams for generating a positive clamping force on said clamping tabs.

12. The support assembly of claim 1, wherein said retention clip further comprises at least one extending protrusion for handling said retention clip and preventing said retention clip from sliding upwards after a cooling solution is attached to said integrated circuit package.

13. The support assembly of claim 1, wherein said shims are made out of plastic and said retention clip is made out of stainless steel.

14. The support assembly of claim 1, wherein said shims and said retention clip are made out of stainless steel.

15. A method of supporting an integrated circuit package with an array of solder columns extending from a bottom surface of said integrated circuit package to a circuit board, said method comprising:

positioning along opposite edges of said integrated circuit package a pair of shims, said shims being placed between and abutting said integrated circuit package and said circuit board;

maintaining a separation between said integrated circuit package and said circuit board with said shims to prevent compression of said solder columns which extend across said separation between said integrated circuit package and said circuit board; and attaching a retention clip to said pair of shims.

16. The method of claim 15, further comprising installing said shims and said retention clip without an adhesive.

17. The method of claim 15, further comprising aligning corners of said integrated circuit package with end protrusions of said shims.

18. The method of claim 17, further comprising supporting said integrated circuit package with a shelf protruding from an inner surface of said shims.

19. The method of claim 15, further comprising engaging at least one attachment device on an outer surface of said shims with at least one clamping tab on said retention clip.

20. The method of claim 19, further comprising providing bent ends of said at least one clamping tab.

21. The method of claim 15, further comprising providing at least one extending protrusion for handling said retention clip and preventing said retention clip from sliding upwards after a cooling solution is attached to said integrated circuit package.

22. The method of claim 19, further comprising providing a beveled surface above said at least one attachment device for allowing a smooth engagement of said retention clip.

23. The method of claim 19, further comprising providing curved beams as part of said retention clip for generating a positive clamping force on said at least one clamping tab.

24. A system for supporting an integrated circuit package with an array of solder columns extending from a bottom surface of said integrated circuit package to a circuit board, said system comprising:

support means for supporting said integrated circuit package, said support means being placed between and abutting said integrated circuit package and said circuit board; and retaining means for retaining said support means for supporting said integrated circuit package;

wherein said support means maintain a separation between said integrated circuit package and said circuit board and prevent compression of said solder columns which extend across said separation between said integrated circuit package and said circuit board.

25. The system of claim 24, further comprising means for installing said support means and said retaining means without an adhesive.

26. The system of claim 24, further comprising means for aligning corners of said integrated circuit package with end protrusions of said means for supporting said integrated circuit package.

27. The system of claim 24, wherein said support means for supporting said integrated package comprise a pair of shims each having a shelf protruding from an inner surface for supporting said integrated circuit package.

28. The system of claim 24, further comprising means for handling said retaining means and preventing said retaining means from sliding upwards after a cooling solution is attached to said integrated circuit package.

29. The system of claim 24, further comprising means for allowing a smooth engagement of said means for retaining said means for supporting said integrated circuit package.

30. The system of claim 24, further comprising means for generating a positive clamping force on said means for supporting said integrated circuit package.

31. A support assembly for supporting an integrated circuit package with an array of solder columns extending from a bottom surface of said integrated circuit package to a circuit board, said support assembly comprising:

a pair of shims for supporting said integrated circuit package, said shims being positioned along opposite edges of said integrated circuit package and placed between and abutting said integrated circuit package and said circuit board; and a retention clip for aligning and securing in place said pair of shims;

wherein said retention clip does not also secure a cooling solution to said integrated circuit package.

32. A support assembly for supporting an integrated circuit package with an array of solder columns extending from a bottom surface of said integrated circuit package to a circuit board, said support assembly comprising:

a pair of shims for supporting said integrated circuit package, said shims being positioned along opposite edges of said integrated circuit package and placed between and abutting said integrated circuit package and said circuit board;

wherein said shims maintain a separation between said integrated circuit package and said circuit board and prevent compression of said solder columns which extend across said separation between said integrated circuit package and said circuit board.

33. The support assembly of claim 32, further comprising a retention clip for retaining said shims in position between said integrated circuit package and said circuit board.

34. The support assembly of claim 33, further comprising one or more raised surfaces on said shims for engaging clamping tabs on said retention clip.

35. The support assembly of claim 33, further comprising one or more handling tabs extending upward from said retention clip.

36. A support assembly for supporting an integrated circuit package with an array of solder columns extending from a bottom surface of said integrated circuit package to a circuit board, said support assembly comprising:

a pair of shims for supporting said integrated circuit package, said shims being positioned along opposite edges of said integrated circuit package and placed between and abutting said integrated circuit package and said circuit board; and a retention clip for aligning and securing in place said pair of shims;

wherein an upper portion of said integrated circuit package extends through a central opening in said retention clip.

37. The support assembly of claim 36, further comprising a cooling solution attached to said upper portion of said integrated circuit package above said retention clip.

38. The support assembly of claim 36, wherein said shims maintain a separation between said integrated circuit package and said circuit board and prevent compression of said solder columns which extend across said separation between said integrated circuit package and said circuit board.

39. A support assembly for supporting an integrated circuit package with an array of solder columns extending from a bottom surface of said integrated circuit package to a circuit board, said support assembly comprising:
- a pair of shims for supporting said integrated circuit package, said shims being positioned along opposite edges of said integrated circuit package and placed between and abutting said integrated circuit package and said circuit board; and
- a retention clip for aligning and securing in place said pair of shims;
- wherein said shims comprise at least one raised area having a beveled surface for engaging said retaining clip.

40. A method of supporting an integrated circuit package with an array of solder columns extending from a bottom surface of said integrated circuit package to a circuit board, said method comprising:
- positioning along opposite edges of said integrated circuit package a pair of shims, said shims being placed between and abutting said integrated circuit package and said circuit board;
- attaching a retention clip to said pair of shims;
- engaging at least one attachment device on an outer surface of said shims with at least one clamping tab on said retention clip; and
- providing a beveled surface above said at least one attachment device for facilitating engagement of said clamping tab.

* * * * *